United States Patent [19]

Meldrum et al.

[11] Patent Number: 5,142,221
[45] Date of Patent: Aug. 25, 1992

[54] AUTOMATIC FUNCTION SELECTING MULTIMETER

[75] Inventors: Glen A. Meldrum, Mountlake Terrace; Glade B. Bacon; Richard E. George, both of Everett, all of Wash.

[73] Assignee: John Fluke Mfg. Co., Inc., Everett, Wash.

[21] Appl. No.: 615,169

[22] Filed: Nov. 23, 1990

[51] Int. Cl.$^5$ .............................................. G01R 19/00
[52] U.S. Cl. ................................... 324/115; 324/130; 341/139; 364/483
[58] Field of Search ..................... 324/99 D, 115, 116, 324/130, 132, 133; 341/139, 155; 364/483

[56] References Cited

U.S. PATENT DOCUMENTS

| | | | |
|---|---|---|---|
| 3,633,201 | 1/1972 | Oesterlin | 341/139 |
| 3,790,886 | 2/1974 | Kurtin et al. | 341/139 |
| 4,016,557 | 4/1977 | Zitelli et al. | 341/139 |
| 4,105,967 | 8/1978 | Macemon | 324/115 |
| 4,329,641 | 5/1982 | Ikeda et al. | 324/115 |
| 4,445,111 | 4/1984 | Swift et al. | 324/130 |
| 4,540,974 | 9/1985 | Schanne et al. | 324/115 |
| 4,584,558 | 4/1986 | Maschek et al. | 341/139 |
| 4,876,502 | 10/1989 | Verbanets et al. | 324/130 |
| 4,989,155 | 1/1991 | Begin et al. | 364/483 |
| 5,003,486 | 3/1991 | Hendel et al. | 364/483 |

Primary Examiner—Ernest F. Karlsen
Assistant Examiner—William J. Burns
Attorney, Agent, or Firm—Richard A. Koske

[57] ABSTRACT

A digital multimeter having automatic function selection capability includes a signal type detector and an analog-to-digital converter formed as an application specific integrated circuit. The signal type detector has a comparator circuit that compares the analog input signal to be measured with predetermined thresholds and stores the resulting values, which are related to the type of analog input signal, in a memory that is also a part of the signal type detector. A controller executes an automatic function selection program that causes the controller to read the stored values and generate a corresponding function code, which causes an analog-to-digital converter to be configured to perform an appropriate conversion function on the analog input signal. When a change in the type of analog input signal is sensed, the controller aborts the present measurement cycle and proceeds with a next measurement cycle in which the changed analog input signal is measured. The controller also produces a change alert signal to indicate that a change in signal type has occurred.

12 Claims, 8 Drawing Sheets

AUTOMATIC FUNCTION SELECTING MULTIMETER

BACKGROUND OF THE INVENTION

The present invention relates generally to digital multimeters capable of performing multiple functions, such as the measurement of different electrical parameters and the performance of continuity and diode tests, and more particularly, to a multimeter having automatic function selection capability.

A digital multimeter having automatic function selection capability is disclosed in copending U.S. patent application Ser. No. 07/442,243 now U.S. Pat. No. 5,119,019, entitled AUTOMATIC FUNCTION SELECTING MULTIMETER, by Richard E. George and assigned to John Fluke Mfg. Co. Inc., the disclosure of which is hereby incorporated by reference.

It is believed that a multimeter formed in accordance with the present invention overcomes several shortcomings of a multimeter formed in accordance with copending application Ser. No. 07/442,243. The multimeter of the copending application requires a substantial number of additional hardware components that hinder attempts to reduce the size, complexity and cost of the multimeter. In addition, it is relatively slow to respond to changes in the type of analog input signal, which results in a noticeable time delay between changes in the analog input signal type and a display of the first correct reading of the new analog input signal. For example, when an AC signal is applied, the multimeter of the copending application will occasionally switch to DC volts and display a DC voltage reading before switching to the proper AC voltage measurement function. Accordingly, there is a need for a multimeter with improved automatic function selection capability, in that the multimeter provides this capability with the addition of very few components and is, therefore, inexpensive to manufacture, provides faster display updating and has a more stable display when a signal is first applied to the meter. The present invention is directed to an improved digital multimeter designed to achieve these results.

SUMMARY OF THE INVENTION

In accordance with the present invention, a digital multimeter for measuring an analog signal appearing at an input terminal of the multimeter and having automatic function selection capability includes a signal type detector for detecting the analog input signal and producing digital logic that is representative of the type of the analog signal appearing at the input terminal of the multimeter. The digital logic is applied to a controller that, in turn, generates a corresponding function code. The function code is applied to an analog-to-digital converter and causes the analog-to-digital converter to perform an appropriate conversion function on the analog input signal so as to produce a digital representation thereof. The digital representative of the analog input signal is applied to the controller, which then generates an output signal that is characteristic of the digital representative and applies the output signal to a display device that generates a display reading indicative of the analog input signal.

In accordance with further aspects of the present invention, the controller reads the digital logic multiple times during a measurement cycle of the analog input signal. A change in value of the digital logic between readings by the controller indicates a change in the type of analog input signal appearing at the input terminal of the multimeter. When a change is sensed, the controller issues a new function code corresponding to the changed analog input signal type. The controller also issues an abort signal to the analog-to-digital converter when a change is sensed, causing the analog-to-digital converter and the controller to abort the present measurement cycle and proceed to a next measurement cycle in which the changed analog input signal is measured. The controller may also issue a change alert signal when a change in the type of analog input signal is sensed, whereby the change alert signal causes an alarm to sound in a distinctive manner for different types of analog input signals.

In accordance with still further aspects of the present invention, the signal type detector includes a comparator circuit having first and second comparators, and a memory. Further, the digital logic includes first and second logic signals. The first comparator compares the analog input signal with a first one of the thresholds and produces the first logic signal that is related to a positive value of the analog input signal and the second comparator compares the analog input signal to a second one of the thresholds and produces the second logic signal that is related to a negative value of the analog input signal. The memory stores the first and second logic signals for retrieval by the controller. The controller executes automatic function selection steps that cause the controller to read and update the stored values of the first and second logic signals multiple times during a measurement cycle of the analog input signal. The controller senses a change in analog signal type when there is a difference between the combined values of the previously stored first and second logic signals and the combined values of the updated first and second logic signals.

In accordance with still further aspects of the present invention, a method for automatic function selection in a digital multimeter includes the steps of detecting an analog input signal and producing digital logic representative of the type of analog input signal appearing at an input terminal of the multimeter, generating a function code corresponding to the value of the digital logic, using the function code to cause an analog-to-digital converter to perform a predetermined conversion function on the analog input signal and producing a display indicative of the analog input signal.

In accordance with yet further aspects of the present invention, the method includes the additional steps of reading the digital logic multiple times during a measurement cycle of the analog input signal, detecting a change in value of digital logic read at different times by the controller during a measurement cycle, confirming the change and aborting the present measurement cycle when a change is confirmed. The method may further include the step of producing an alarm when a change in the type of analog input signals is confirmed.

In accordance with alternative aspects of the present invention, the memory is replaced by an interrupt program executed by the controller. In this alternative embodiment, the first and second logic signals produced by the first and second comparators are applied as interrupt request inputs to the controller, thereby causing the interrupt program to issue appropriate instructions to the controller, which then generates the appropriate function code for the analog-to-digital converter.

As will be readily appreciated from the foregoing summary, the present invention provides s digital multimeter having improved automatic function selection capability, wherein the automatic feature requires few additional hardware components, provides indications when the type of analog input signal changes, provides a more stable display when the type of analog input signals changes and provides faster display updating when changes occur.

BRIEF DESCRIPTION OF THE DRAWINGS

The foregoing and other advantages of this invention will become more readily appreciated as the same becomes better understood by reference to the following detailed description taken in conjunction with the accompanying drawings, wherein.

DESCRIPTION OF THE PREFERRED EMBODIMENT

As previously noted, a digital multimeter having automatic function selection capability is set forth in copending U.S. Pat. application, Ser. No. 07/422,243, entitled AUTOMATIC FUNCTION SELECTING MULTIMETER, by Richard E. George and assigned to John Fluke Mfg. Co. Inc. As also noted above, the contents of U.S. Pat. application Ser. No. 07/442,243, are hereby incorporated by reference. Accordingly, details of the automatic function selection feature disclosed therein are not repeated herein. However, a brief overview of this feature is presented below in order to permit a better understanding of the improvements provided by the present invention.

As discussed in the above-noted, copending application, a hardware implementation of an automatic function selecting multimeter includes sensing circuitry that senses the type of analog signal appearing at the input terminals of the meter. The signal may be, for example, an ac or dc voltage or current, or even an impedance. In any event, the sensing circuitry, which includes activity sensors and hold circuits comprised mostly of individual hardware (i.e., discrete) components, generates, sensing signals that are characteristic of the type of input signal being measured. An encoder, which is also a discrete component, receives these sensing signals and produces encoding signals that are applied to the analog-to-digital converter, thereby causing the converter to be configured to perform an appropriate conversion function of the analog input signal.

Figure 1:
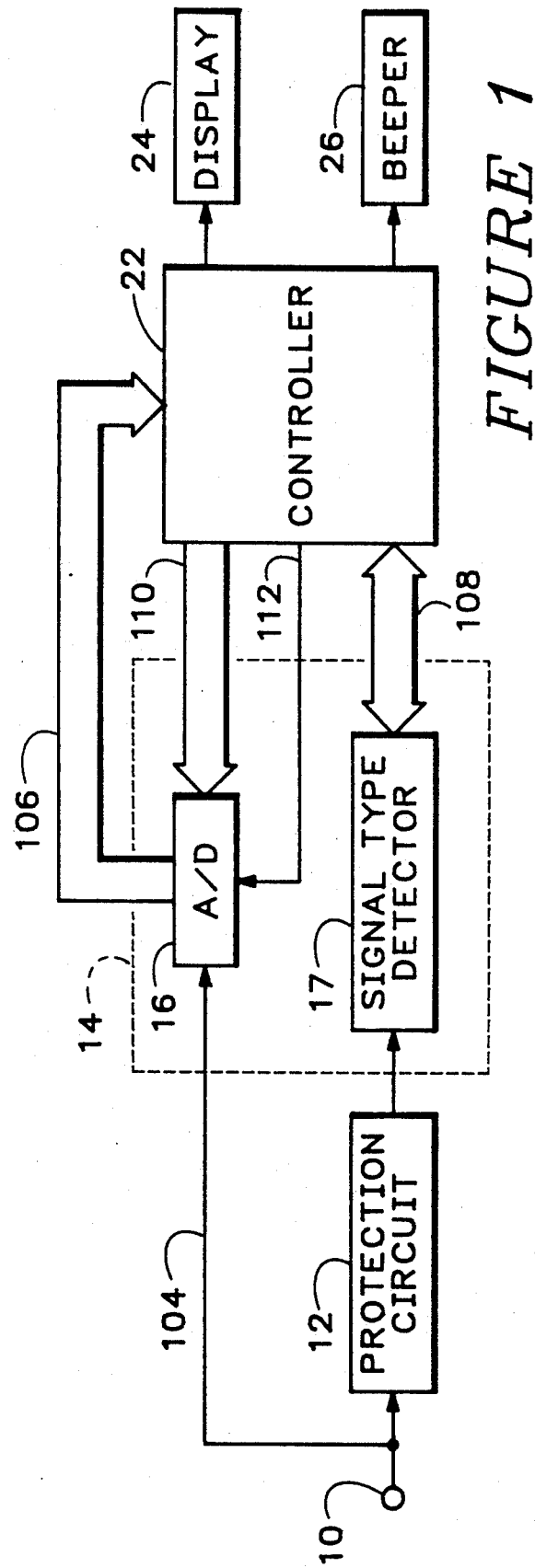
FIG. 1 is a block diagram illustrating various important features of a digital multimeter formed in accordance with the present invention.

Turning now to FIG. 1 there is illustrated, in simplified block diagram form, a portion of a digital multimeter having automatic function selection capability in accordance with the present invention. Basically, the portion of the multimeter depicted in FIG. 1 comprises a protection circuit 12, an integrated circuit (IC) 14, a controller 22, a display 24 and, preferably, an alarm depicted illustratively in FIG. 1 as a beeper 26. The operation of these components in performing the automatic function selection feature of the present invention is set forth next.

As unknown analog input signal that is to be measured is applied to the IC 14 via an input terminal 10 of the multimeter (not shown) and the protection circuit 12. The protection circuit 12 protects the other circuitry in the multimeter, including the IC 14, by limiting excessive currents caused by high positive or negative voltages being applied to the multimeter via input terminal 10. In accordance with a preferred embodiment of the present invention the IC 14 is preferably an application specific integrated circuit (ASIC) that includes an analog-to-digital converter (A/D converter) 16 and a signal type detector 17. The output of the protection circuit 12 is applied to an input of the signal type detector 17, which in a manner discussed more fully below, generates digital logic representative of the type of analog input signal appearing at the input terminal 10. The analog input signal is also applied to the A/D converter 16 without passing through the protection circuit 12.

The controller 22 receives the digital logic from the signal type detector 17 via bus 108 and generates a corresponding function code that is determined by the value of the digital logic. The function code is applied to the A/D converter 16 via bus 110, which causes the A/D converter 16 to be configured to perform an appropriate conversion function on the analog input signal so as to produce a digital output that is representative of the analog input signal. One or more of these digital outputs from the A/D converter 16 makes up a measurement cycle of the analog input signal. Whether one or multiple readings of the A/D output are made during a measurement cycle depends on the particular A/D scheme used and, in any event, is not an important aspect of the present invention. The controller 22 receives the digital output of the A/D converter 16 via bus 106 and provides a corresponding output to display 24.

The controller 22 reads the digital logic from the signal type detector 17 during a measurement cycle of the analog input signal. Preferably, the controller 22 reads the digital logic multiple times during each measurement cycle. In accordance with one commercial embodiment of the present invention, the controller 22 reads the digital logic eight times during each measurement cycle. It is to be understood, however, that the particular quantity of readings is not critical to practicing the automatic function selection feature of the present invention.

When a change in the type of analog input signal is sensed, that is when there is a difference between values of the digital logic read by the controller, the microprocessor 22 issues a new function code in accordance with the type of the changed analog input signal and an abort command to the A/D converter 16 via line 112. The abort signal causes the A/D converter 16 and the controller 22 to abort the present measurement cycle and proceed with the next measurement cycle, that is, a measurement of the changed analog input signal. The abort signal allows a reading of the changed analog input signal to be displayed more quickly than was possible with prior art multimeters, such as the multimeter disclosed in copending application, Ser. No. 07/442,243.

In addition, as briefly noted above and as will be more fully discussed below, the automatic function selection program executed by the controller 22 performs, in addition to other important functions, the function of the hardware encoder disclosed in the earlier-filed copending application. Accordingly, the function code generated by the microprocessor 22 eliminates the need for a separate hardware encoder, thereby reducing the number of discrete components in the multimeter. As noted above, fewer discrete components translate into lower manufacturing costs and increased likelihood of miniaturization of the multimeter, both of which are desirable.

The controller 22 depicted in FIG. 1 is preferably a microprocessor that controls various functions of the multimeter in addition to automatic function selection. Accordingly, it is most likely not necessary to add an additional microprocessor or other type of controller to the multimeter for controlling the automatic function selection feature. All that is required is that the controller 22 have the capacity and the ability to operate in the manner discussed below.

Figure 2:
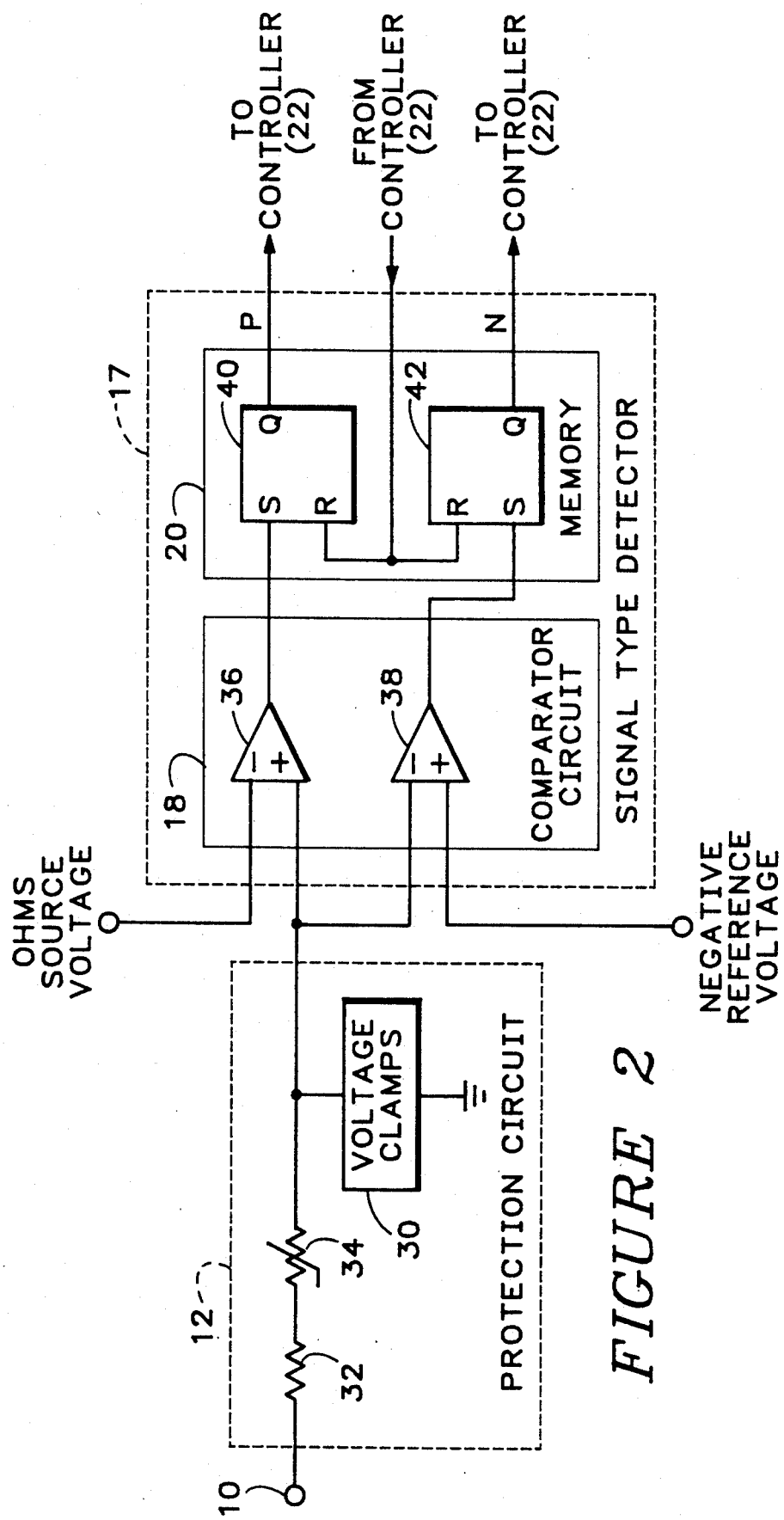
FIG. 2 is a simplified schematic diagram of a preferred embodiment of a portion of the digital multimeter depicted in FIG. 1.

Turning next to FIG. 2, a preferred embodiment of the protection circuit 12 and the signal type detector 17 are illustrated in simplified schematic form. The protection circuit 12 includes an input resistor 32, a thermistor 34, and voltage clamp 30. In one commercial embodiment of the present invention, the voltage clamp 30 comprises a pair of voltage clamps (not shown) consisting of bipolar transistors connected to limit both positive and negative overvoltages. As noted above, the protection circuit 12 protects the signal type detector 17 as well as other circuitry in the multimeter from damage. It is to be appreciated, however, that the present invention may be readily practiced without the protection circuit 12.

The signal type detector 17 comprises a comparator circuit 18 and a memory 20. The comparator further comprises a pair of comparators 36 and 38 and the memory 20 further comprises a pair of RS-type flip-flops 40 and 42. The comparators 36 and 38 replace the discrete activity sensors disclosed in copending patent application, Ser. No. 07/442,243, and the RS-Type flip-flops 40 and 42 replace the discrete hold circuits of the copending application. Because these elements (comparators 36 and 38, and flip-flops 40 and 42) may be formed as part of the IC 14, the number of discrete components in the multimeter is reduced. The operation of these elements is discussed next.

The output of the protection circuit 12 is applied to the noninverting input of comparator 36 and the inverting input of comparator 38. The inverting input of comparator 36 is connected to a predetermined voltage, denoted OHMS SOURCE VOLTAGE in FIG. 2. The OHMS SOURCE VOLTAGE is preferably provided by a voltage source internal to the multimeter, such as, for example, a 1.3 volt source used by the multimeter to measure resistance. The noninverting input of comparator 38 is connected to a negative reference voltage, denoted NEGATIVE REFERENCE VOLTAGE, and is also, preferably, provided by a source internal to the multimeter. Thus, as is apparent from the preceding discussion, as well as with reference to FIG. 2, the output of comparator 36 is high and the output of comparator 38 is low when the magnitude of the analog input signal that is to be measured exceeds the magnitude of the OHMS SOURCE VOLTAGE. Conversely, when the input signal goes below the NEGATIVE REFERENCE VOLTAGE, the comparator output states are reversed.

The outputs of comparators 36 and 38 are connected to the S (data) input terminals of flip-flops 40 and 42. That is, the output of comparator 36 is stored in flip-flop 40 and the output of comparator 38 is stored in flip-flop 42. The Q (output) terminals of flip-flops 40 and 42 are connected to the controller 22. A pair of logic signals, denoted P and N, are formed at the output terminals of flip-flops 40 and 42, respectively. A reset signal is supplied by the controller 22 and is applied to the R (reset) terminals of both flip-flops 40 and 42. At appropriate times, the controller 22 reads the values of the comparator outputs that are stored in flip-flops 40 and 42, and subsequently issues a reset signal to reset the flip-flops. In this manner, the P and N logic signals ready by the controller 22 represent the type of analog input signal appearing at the multimeter input terminal 10. An example of one possible relationship between the values of P and N and the type of analog input signal is illustrated below in TABLE A.

TABLE A

| P | N | ANALOG INPUT SIGNAL TYPE |
|---|---|---|
| 0 | 0 | Ohms or continuity |
| 1 | 0 | Positive DC volts |
| 0 | 1 | Negative DC volts |
| 1 | 1 | AC volts |

As noted above, the microprocessor (i.e., controller) 22 executes a program, hereinafter the "auto-function program", that controls the automatic function selection feature of a digital multimeter formed in accordance with the present invention. Under the control of the auto-function program, the microprocessor 22 reads the digital logic produced by the signal type detector, generates function code whose value corresponds to value of the digital logic produced by the signal type detector and applies the function code to the analog-to-digital converter 16 so as to cause the converter 16 to be configured to perform the proper conversion function on the analog input signal to be measured. The auto-function program further instructs the microprocessor 22 to generate a new function code when a change in type of analog input signal is sensed, and preferably confirmed, and to abort the present measurement cycle and proceed with a new measurement cycle, in which the changed analog input signal is measured. The program may also instruct the microprocessor 22 to produce a change alert signal that indicates when a change occurs as well as the type of changed analog input signal.

Figure 3:
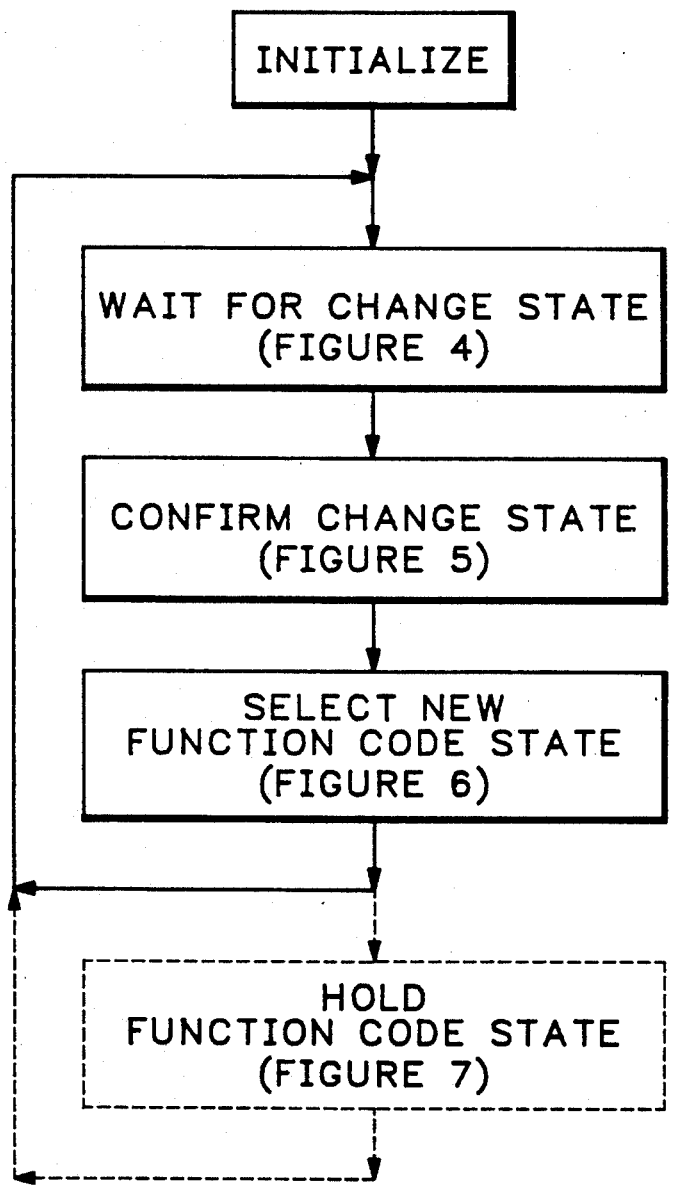
FIG. 3 is a flow chart illustrating broad functional steps, or states, of an automatic function selection program executed by a controller in the multimeter depicted in FIG 1.

Turning to FIG. 3, the auto-function program is depicted as comprising a series of states that are executed in a particular order. Each state contains a series of steps, which are discussed more fully below and are illustrated in FIGS. 4-7. As shown in FIG. 3, the first step executed by the auto-function program is to INITIALIZE the microprocessor, which typically occurs when the multimeter is turned on. During this step an initial type of input signal is sensed and stored as "Last Signal Type". The program then proceeds to a WAIT FOR CHANGE STATE during which the program instructs the microprocessor to sense the input signal being measured and to wait in this state until the type of signal appearing at the input terminal of the multimeter changes. When a change is detected, the program instructs the microprocessor to proceed to a CONFIRM CHANGE STATE during which the program confirms that a change in signal type has occurred and that the changed signal type is still present. Once this condition is satisfied the program instructs the microprocessor to abort measurement and proceed to a SELECT NEW FUNCTION CODE STATE during which the program causes the microprocessor to issue a function code that is representative of the changed signal type detected in the previous step. As discussed above, the function code is applied to an analog-to-digital converter and causes the converter to be configured in an appropriate manner so as to perform a predetermined conversion function on the analog input signal. Next, the program returns to the WAIT FOR CHANGE STATE and reexecutes the above states.

In addition to the above states, the auto-function program may execute another, denoted in FIG. 3 as a HOLD FUNCTION CODE STATE. This state is depicted by dashed lines to indicate that it is an alternative state that may or may not be included in the auto-function program. In any event, the HOLD FUNCTION CODE STATE is not required to practice the present invention. During this state, the auto-function program executes steps that instruct the microprocessor to hold the function code (generated in the SELECT NEW FUNCTION CODE STATE) for a predetermined period of time, such as for several measurement cycles, before returning to the WAIT FOR CHANGE STATE. When Incorporated into the program, this state allows a display of the input signal to remain steady despite bursts of different input signals.

The CONFIRM CHANGE STATE, discussed briefly above, is also not necessary to practice the present invention and may be omitted from the auto-function program. Basically, the CONFIRM CHANGE STATE blocks the microprocessor from changing the function code when certain disturbances, such as glitches, occur in the analog input signal. In effect, this step acts to "filter" these disturbances from the analog input signal so that they do not affect the display. In any event, this step may not be necessary in certain applications, such as, for example, where the analog input signal is very stable. In that case the CONFIRM CHANGE STATE may be omitted so that the auto-function program proceeds from the WAIT FOR CHANGE STATE directly to the SELECT NEW FUNCTION CODE STATE.

In order to permit a better understanding of the auto-function program, each of the states discussed briefly above will now be presented in somewhat greater detail.

Figure 4:
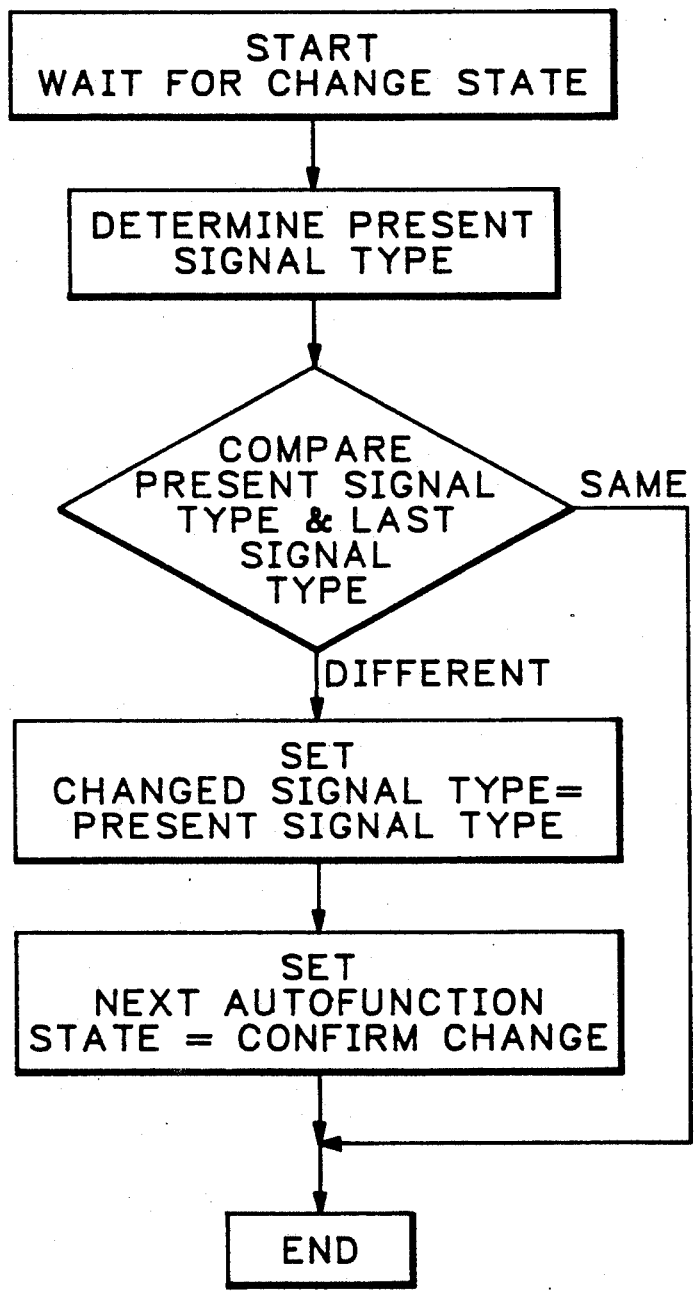
FIGS. 4 through 7 are a series of flow charts illustrating in somewhat greater detail the functional steps depicted in FIG. 3.

Turning to FIG. 4, there is illustrated a flow chart depicting various functional steps of the WAIT FOR CHANGE STATE. For discussion purposes, it is assumed that the INITIALIZE step has already occurred and an initial input signal type has been read by the microprocessor and stored as Last Signal Type. Next the program instructs the microprocessor to DETERMINE PRESENT SIGNAL TYPE. Here, the microprocessor determines the "Present Signal Type" by reading the present P and N signal values stored in memory, which as noted above and illustrated in Table A, are representative of the type of analog input signal beng measured.

Once the Present Signal Type has been determined, the program instructs the microprocessor to COMPARE PRESENT SIGNAL TYPE AND LAST SIGNAL TYPE. If the types of analog input signals are the same, such as when both signals are AC voltages (i.e., $P=N=1$, for both signals), the WAIT FOR CHANGE STATE ends and the program awaits further instruction from the microprocessor to proceed to the next state. If, however, the Present Signal Type is different than the Last Signal Type, the program proceeds to the next step, which is SET CHANGED SIGNAL TYPE EQUAL TO PRESENT SIGNAL TYPE, wherein the value of a new variable, Changed Signal Type, is set equal to the value of Present Signal Type. The significance of this step will become apparent from the discussion of the CONFIRM CHANGE STATE which follows. Next the program proceeds to SET NEXT AUTOFUNCTION STATE EQUAL TO CONFIRM CHANGE STATE. Accordingly, when the auto-function program receives instructions to proceed to the next state, the program will, in this case, proceed to the CONFIRM CHANGE STATE. At this point, the program ends the WAIT FOR CHANGE STATE and awaits instructions to proceed to the next state.

Figure 5:
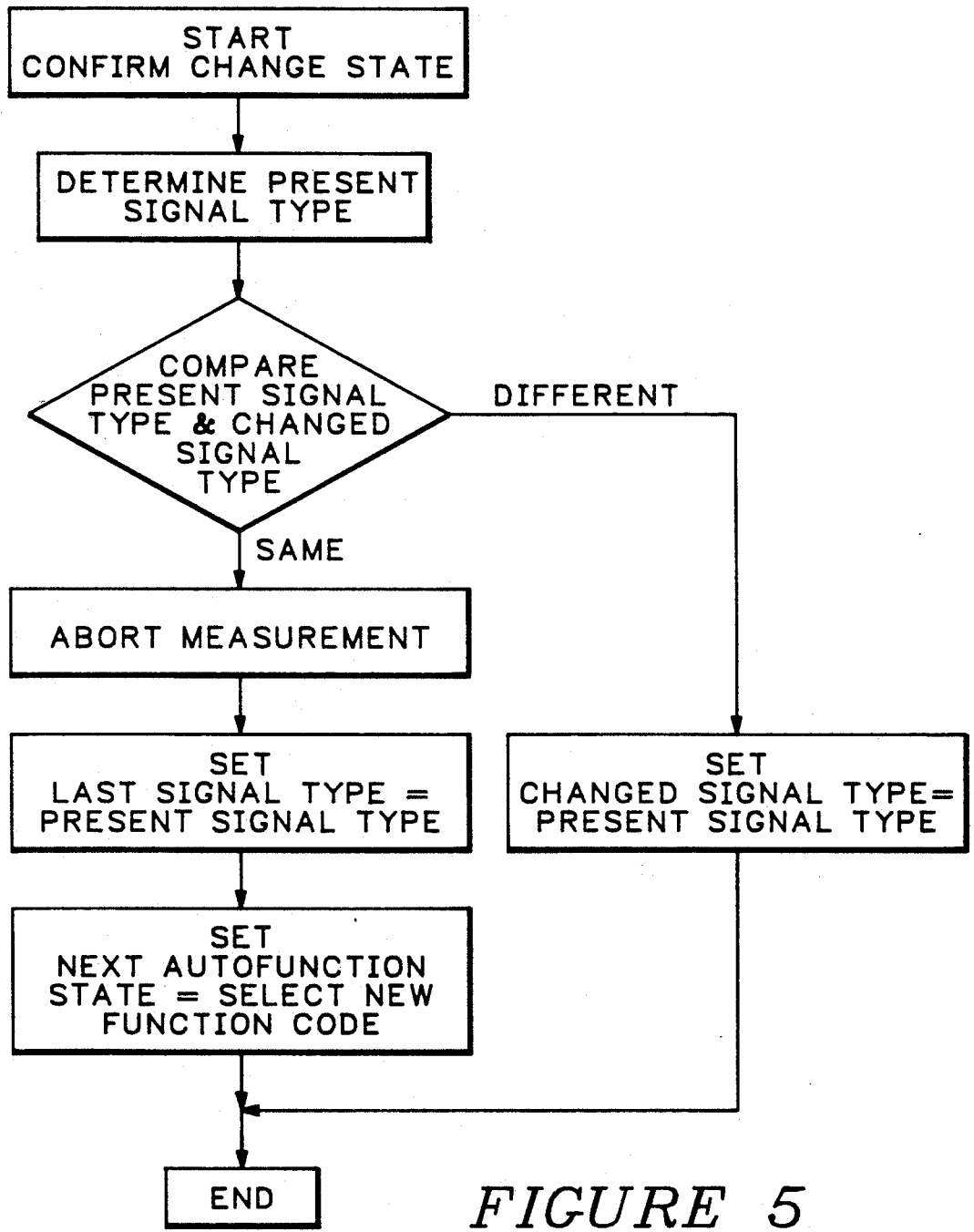

FIG. 5 is a flow chart depicting various functional steps of the CONFIRM CHANGE STATE of the auto-function program briefly described above. Upon receiving the appropriate command from the microprocessor, the program initiates the CONFIRM CHANGE STATE, as illustrated by the START step in FIG. 5. Next the program proceeds to DETERMINE PRESENT SIGNAL TYPE, wherein the program instructs the microprocessor to determine the Present Signal Type in the same manner as discussed above for the WAIT FOR CHANGE STATE. Next, the program confirms that a change in signal type has occurred by instructing the microprocessor to COMPARE PRESENT SIGNAL TYPE AND CHANGED SIGNAL TYPE. If the signal types are different, the program proceeds to equate the two variables in the next step, SET CHANGED SIGNAL TYPE EQUAL TO PRESENT SIGNAL TYPE, and then awaits instructions to proceed to the next state. If, however, the signal types are the same, the program proceeds to ABORT MEASUREMENT, where the program instructs the microprocessor to abort the present measurement cycle. The program then equates the Last and Present Signal Types in the step, SET LAST SIGNAL TYPE EQUAL TO PRESENT SIGNAL TYPE. Next the program proceeds to SET NEXT AUTOFUNCTION STATE EQUAL TO SELECT NEW FUNCTION CODE STATE and ends the CONFIRM CHANGE STATE and awaits instructions to proceed to the next state.

Figure 6:
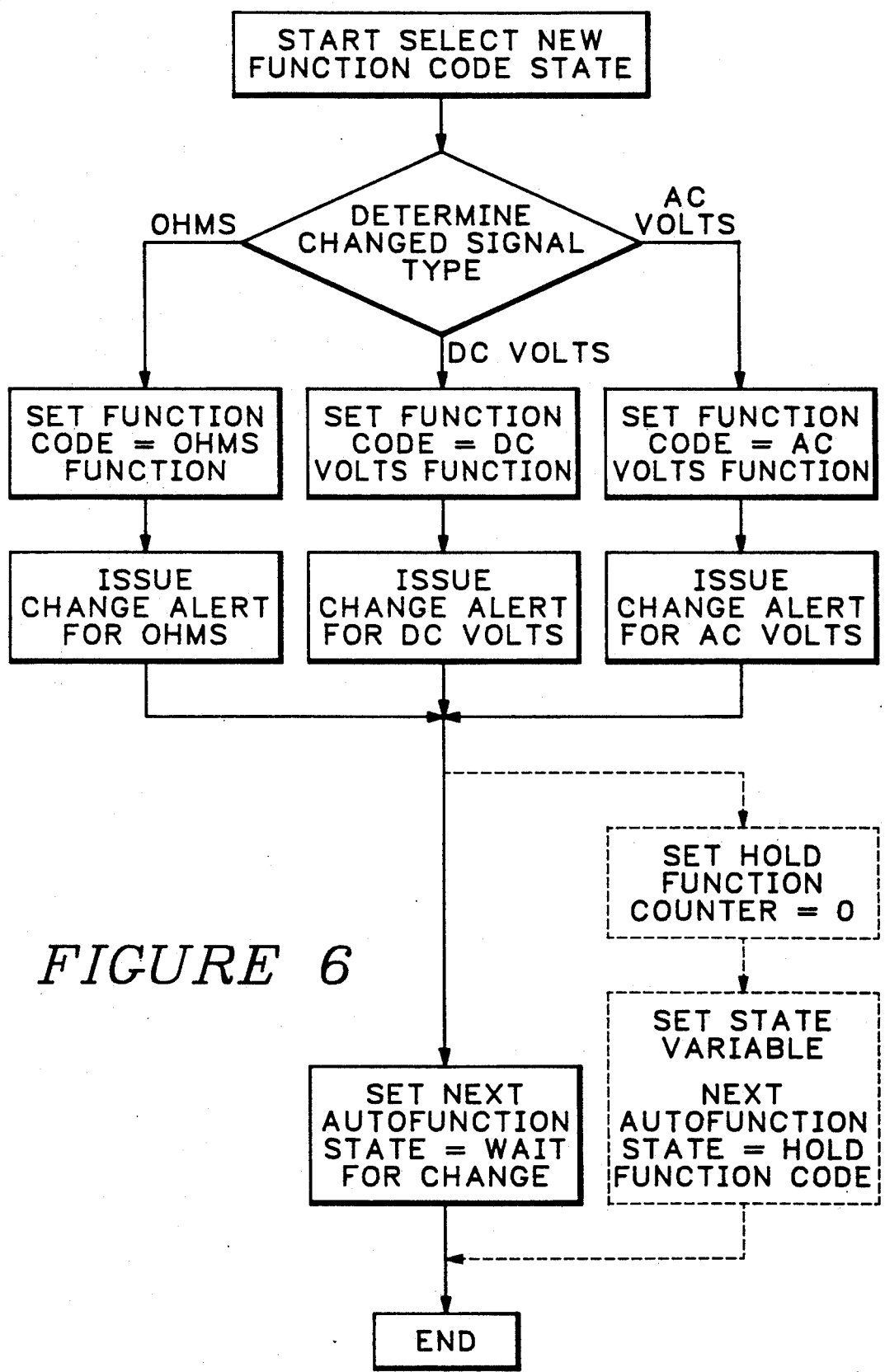

FIG. 6 is a flow chart depicting various functional steps of the SELECT NEW FUNCTION CODE STATE of the auto-function program. When the program receives the appropriate instructions, it begins the SELECT NEW FUNCTION CODE STATE (indicated as the START step in FIG. 6). Next the program proceeds to the DETERMINE CHANGED SIGNAL TYPE step. If the Changed Signal Type is an ohms signal, that is, for example, when $P=N=0$, program proceeds to SET FUNCTION CODE EQUAL TO OHMS FUNCTION. Similarly, if the Changed Signal Type is a DC voltage signal, that is, for example, when $P=1$ and $N=0$, or $P=0$ and $N=1$, the program proceeds to SET FUNCTION CODE EQUAL TO DC VOLTS FUNCTION. Lastly, if the Changed Signal Type is an AC voltage signal, that is, for example, when P=N=1, the program proceeds to SET FUNCTION CODE EQUAL TO AC VOLTS FUNCTION.

After the program sets the Function Code, the program proceeds to one of the ISSUE CHANGE ALERT steps, where the program instructs the microprocessor to issue the appropriate Change Alert signal, i.e., for Ohms, DC Volts or AC Volts,. Preferably, the Change Alert signal is different for different Changed Signal Types, so as to cause a beeper (FIG. 1) to produce a distinct sound for each of the different Changed Signal Types. For example, the Change Alert signal may cause the beeper to emit one (1) beep when the Changed Signal Type is ohms, two (2) beeps when the Changed Signal Type is DC volts and three (3) beeps when the Changed Signal Type is AC volts.

Next the program proceeds to SET NEXT AUTO-FUNCTION STATE EQUAL TO WAIT FOR CHANGE STATE. At this point, the program ends the SELECT NEW FUNCTION CODE STATE and awaits instructions to return to the WAIT FOR CHANGE STATE, at which point in time the auto-function program repeats the above steps.

Alternatively, as noted above and depicted in FIG. 3, the auto-function program may include a HOLD FUNCTION CODE STATE, in which case the SELECT NEW FUNCTION CODE STATE includes additional steps indicated by phantom lines in FIG. 6. More particularly, after the microprocessor issues a Change Alert signal, the program proceeds to SET HOLD FUNCTION COUNTER EQUAL TO ZERO, whereby a Hold Function Counter, whose count value represents measurement cycles, is initialized. The program then proceeds to SET NEXT AUTOFUNCTION STATE EQUAL TO HOLD FUNCTION CODE STATE, which is discussed below. Once this last step is completed, the program ends the SELECT NEW FUNCTION CODE STATE and awaits instructions to proceed to the next state.

Figure 7:
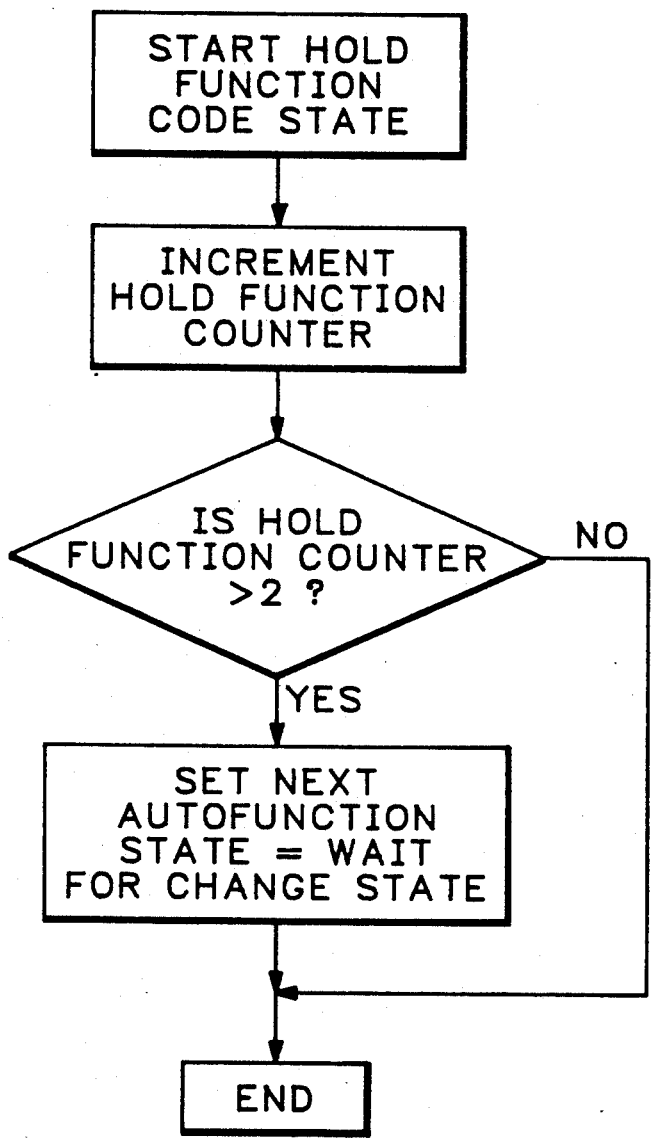

FIG. 7 is a flow chart depicting the functional steps of the HOLD FUNCTION CODE STATE. When the program receives the appropriate instructions, it begins the HOLD FUNCTION CODE STATE (indicated as the START step in FIG. 7). Next the program increments the Hold Function Counter and determines whether the value of the counter exceeds a predetermined limit, such as two (2), for example, representing two measurement cycles. If the counter value does not exceed the limit, the program ends the HOLD FUNCTION COUNTER STATE and awaits further instructions to proceed. One instruction, for example, may be to repeat the HOLD FUNCTION CODE STATE, whereby the Hold Function Counter is again incremented and its value tested in accordance with the above steps. This process is repeated until the test is satisfied, that is, when the counter value exceeds the predetermined limit, at which point the program proceeds to SET NEXT AUTOFUNCTION STATE EQUAL TO WAIT FOR CHANGE STATE. Lastly, the program ends the HOLD FUNCTION CODE STATE and awaits instructions to proceed to the next state, such as the WAIT FOR CHANGE STATE, at which point the auto-function program repeats the steps discussed above and illustrated in FIGS. 4-7.

Figure 8:
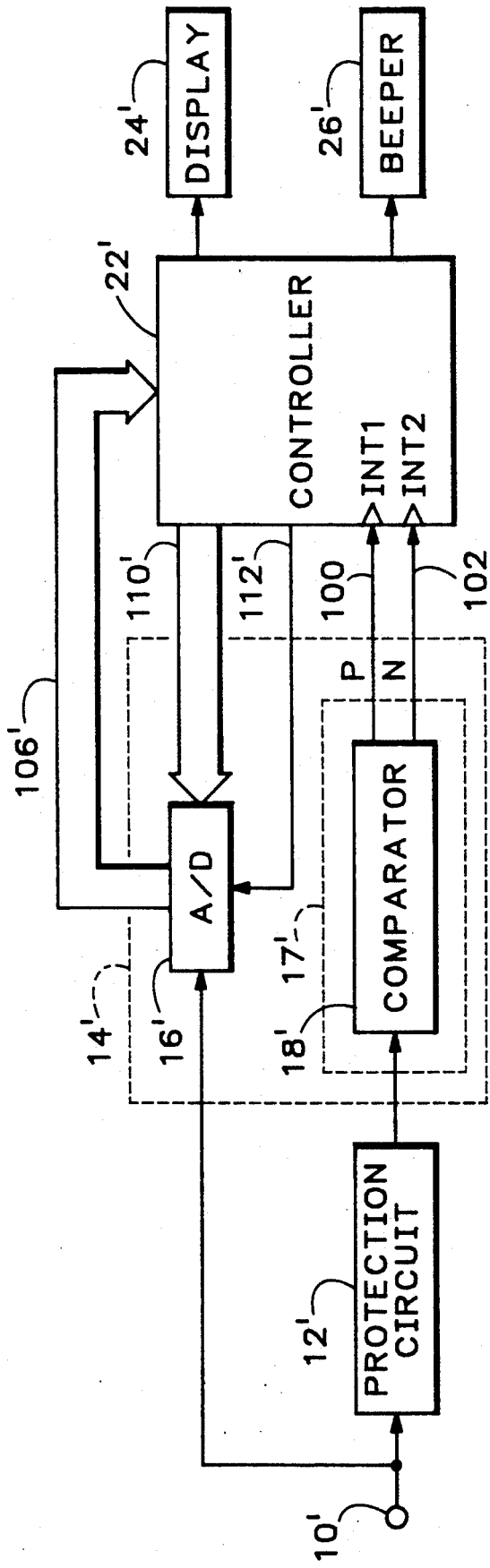
FIG. 8 is a block diagram of an alternative embodiment of a digital multimeter formed in accordance with the present invention.

FIG. 8 illustrates, in block diagram form, an alternative embodiment of the present invention. The similarity between the embodiment depicted in FIG. 8 and the embodiment depicted in FIG. 1 is readily apparent from a review of these two figures. For purposes of clarity, the same reference numbers are used to refer to like components in both figures, except that the like numbers are primed in FIG. 8. In this alternative embodiment the storage device 20 (FIG. 1) is omitted and the signal type detector 17' comprises the comparator circuit 18'. The outputs of the comparator circuit 18' are coupled to interrupt inputs on the microprocessor 22, denoted INT 1 and INT 2, via respective lines 100 and 102, which unlike the bus 108 in FIG. 1, are dedicated signal lines. The output signal appearing on line 100, denoted P', is related to a positive value of the analog input signal and the output signal on line 102, denoted N', is related to a negative value of the analog input signal.

Preferably, the INT1 and INT2 inputs are rising edge triggered, so that when the P' and N' signals go high (a logic 1 state), corresponding P' and N'0 interrupts are requested. When the P' interrupt is requested, a positive (P') flag is set in the auto-function program. Similarly, when the N' interrupt is requested, a negative (N') flag is set. Accordingly, in this alternative embodiment, the controller 22 (FIG. 8) determines the Present Signal Type from the positive and negative flags set by the interrupts. After the controller uses the P' and N' flags, the controller resets the flags, which is functionally similar to resetting flip-flops 40 and 42 discussed above. Accordingly, the P' and N' flags replace the outputs of the two RS flip-flops 40 and 42 (FIG. 2). Thus, the interrupt algorithm of this alternative embodiment, along with the auto-function program, eliminate the need for the flip-flops and reduce the number of necessary hardware components. While preferred and alternative embodiments of the present invention have been illustrated and described, it will be appreciated that various changes can be made therein without departing from the spirit and scope of the invention. For example, JK-type flip-flops could be used in place of RS-types flip-flops if triggered by an appropriate clock signal and the controller could be implemented in the ASIC along with the A/D converter and the signal type detector if the ensuing increase in IC cost was acceptable. Likewise, a digital controller could be used as the controller instead of a microprocessor. Consequently, the invention can be practiced otherwise than as specifically described herein.

The embodiments of the invention of which an exclusive property or privilege is claimed are defined as follows:

1. A method for causing a digital multimeter to automatically select appropriate measurement functions for different types of analog signals appearing at the input terminal of the multimeter, said method comprising the steps of:
   (a) detecting the analog input signal;
   (b) producing first data representative of the type of analog input signal to be measured when said analog input signal is an AC signal;
   (c) producing second data representative of the type of said analog input signal to be measured when said analog input signal is a DC signal;
   (d) generating function code corresponding to one of said first and second data;
   (e) using said function code to cause an analog-to-digital converter to be configured to perform an appropriate conversion function on the analog input signal to be measured; and
   (f) producing a display indicative of said analog input signal.

2. A method according to claim 1 further comprising the steps of:
   (a) reading said data representative of the type of analog input signal during a present measurement cycle;
   (b) detecting a change in the type of the analog input signal during said present measurement cycle;
   (c) aborting said present measurement cycle when said change is detected and proceeding to a next measurement cycle wherein the changed analog input signal is to be measured; and
   (d) producing an alarm when said change is detected.

3. A method according to claim 2 further comprising the step of confirming said change before aborting said present measurement cycle.

4. A digital multimeter for measuring an analog signal appearing at the input terminal of the multimeter comprising:
   (a) a signal type detector for detecting said analog input signal and producing first data representative of the type of said analog input signal to be measured when said analog input signal is an AC signal and producing second data representative of the type of said analog input signal to be measured when said analog input signal is a DC signal, wherein said first data differs from said second data;
   (b) control means for receiving said data and producing corresponding function code;
   (c) conversion means for converting the analog input signal to a digital representation thereof, wherein said function code causes said conversion means to be configured to perform an appropriate conversion function on the analog input signal to be measured; and
   (d) a display coupled to said control means for displaying a reading of said analog input signal, wherein said control means receives said digital representation of said analog input signal and produces a related output signal that is applied to said display so as to result in said reading of said analog input signal.

5. A multimeter according to claim 4, wherein said signal type detector comprises a comparator circuit coupled to receive the analog input signal, such that said comparator circuit compares the analog input signal with predetermined thresholds to produce said data related to the type of analog input signal appearing at the input of the multimeter.

6. A multimeter according to claim 5, wherein said comparator circuit comprises a first comparator for comparing the analog input signal with a first one of said thresholds and producing a first logic signal related to a positive value of the analog input signal and a second comparator for comparing the analog input signal to a second one of said thresholds and producing a second logic signal related to a negative value of the analog input signal, said first and second logic signals forming said data representative of the type of analog input signal to be measured.

7. A multimeter according to claim 6, wherein said signal type detector further comprises memory coupled to said first and second comparators for storing said first and second logic signals and supplying stored values of said first and second logic signals to said control means.

8. A multimeter according to claim 7, wherein said memory comprises a first flip-flop for storing said stored value of said first logic signal and a second flip-flop for storing said stored value of said second logic signal.

9. A multimeter according to claim 8, wherein said signal type detector and said conversion means are formed as an application specific integrated circuit.

10. A multimeter according to claim 7, wherein said control means includes:
    (a) means for reading said stored values of said first and second logic signals during a measurement cycle in which the analog input signal is being measured;
    (b) means for aborting said present measurement cycle when the stored values read by said control means indicate a change in type of analog input signal appearing at the input terminal of the multimeter; and
    (c) means for producing a change alert signal when a change in the type of analog input signal is sensed.

11. A multimeter according to claim 10 further comprising an alarm device coupled to receive said change alert signal from said control means and produce an alarm indicating said change in the type of analog input signal has been sensed.

12. A multimeter according to claim 11, wherein said alarm produced by said alarm device is indicative of the type of changed analog input signal.

* * * * *